(12) United States Patent
Sutardja

(10) Patent No.: US 9,059,160 B1
(45) Date of Patent: Jun. 16, 2015

(54) SEMICONDUCTOR PACKAGE ASSEMBLY

(75) Inventor: Sehat Sutardja, Los Altos Hills, CA (US)

(73) Assignee: Marvell International Ltd., Hamilton (BM)

(*) Notice: Subject to any disclaimer, the term of this patent is extended or adjusted under 35 U.S.C. 154(b) by 720 days.

(21) Appl. No.: 13/288,862

(22) Filed: Nov. 3, 2011

Related U.S. Application Data

(60) Provisional application No. 61/426,753, filed on Dec. 23, 2010.

(51) Int. Cl.
*H01L 23/495* (2006.01)
*H01L 23/498* (2006.01)
*H01L 23/488* (2006.01)

(52) U.S. Cl.
CPC ........ *H01L 23/49827* (2013.01); *H01L 23/488* (2013.01)

(58) Field of Classification Search
CPC ................ H01L 23/488; H01L 23/495; H01L 23/49534; H01L 23/52; H01L 23/49827
USPC .................................. 257/666, 676
See application file for complete search history.

(56) References Cited

U.S. PATENT DOCUMENTS

| | | | | |
|---|---|---|---|---|
| 6,317,331 B1 * | 11/2001 | Kamath et al. | ................ | 361/760 |
| 7,435,619 B2 * | 10/2008 | Shim et al. | .................... | 438/107 |
| 7,642,656 B2 * | 1/2010 | Yoo et al. | ...................... | 257/777 |
| 7,968,991 B2 * | 6/2011 | Wong et al. | .................... | 257/686 |
| 8,018,068 B1 * | 9/2011 | Scanlan et al. | ................ | 257/774 |
| 8,063,475 B2 * | 11/2011 | Choi et al. | ..................... | 257/686 |
| 8,581,381 B2 * | 11/2013 | Zhao et al. | .................... | 257/686 |
| 2007/0290376 A1 * | 12/2007 | Zhao et al. | .................... | 257/787 |
| 2009/0146314 A1 * | 6/2009 | Akaike et al. | ................. | 257/777 |
| 2009/0152740 A1 * | 6/2009 | Park et al. | ...................... | 257/778 |
| 2010/0171206 A1 * | 7/2010 | Chu et al. | ....................... | 257/686 |
| 2011/0024888 A1 * | 2/2011 | Pagaila et al. | ................. | 257/686 |
| 2011/0031610 A1 * | 2/2011 | Yamazaki et al. | ............ | 257/693 |
| 2011/0291288 A1 * | 12/2011 | Wu et al. | ........................ | 257/774 |
| 2012/0161331 A1 * | 6/2012 | Gonzalez et al. | ............. | 257/774 |

* cited by examiner

Primary Examiner — David S Blum

(57) ABSTRACT

Embodiments of the present disclosure provide an apparatus comprising a substrate having (i) a first side configured to receive a semiconductor die and (ii) a second side disposed opposite to the first side. The substrate comprises a printed circuit board material. The apparatus further comprises an interposer that is (i) disposed in the substrate and (ii) configured to electrically couple the first side of the substrate and the second side of the substrate. The interposer comprises a semiconductor material.

25 Claims, 5 Drawing Sheets

SEMICONDUCTOR PACKAGE ASSEMBLY

CROSS REFERENCE TO RELATED APPLICATIONS

This disclosure claims priority to U.S. Provisional Patent Application No. 61/426,753, filed Dec. 23, 2010, the entire specification of which is hereby incorporated by reference in its entirety for all purposes, except for those sections, if any, that are inconsistent with this specification.

TECHNICAL FIELD

Embodiments of the present disclosure relate to the field of integrated circuits, and more particularly, to techniques, structures, and configurations of electronic package assemblies.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on semiconductor dies or chips that continue to scale in size to smaller dimensions. The shrinking dimensions of these features are challenging conventional routing configurations of power and/or ground signals for semiconductor dies in electronic package assemblies.

SUMMARY

In one embodiment, the present disclosure provides an apparatus comprising a substrate having (i) a first side configured to receive a semiconductor die and (ii) a second side disposed opposite to the first side. The substrate comprises a printed circuit board material. The apparatus further comprises an interposer that is (i) disposed in the substrate and (ii) configured to electrically couple the first side of the substrate and the second side of the substrate. The interposer comprises a semiconductor material.

In another embodiment, the present disclosure also provides a method that comprises providing a substrate having a first side and a second side, forming a window within the substrate, providing an interposer within the window, and positioning a semiconductor die on the first side of the substrate. The interposer is configured to electrically couple the semiconductor die and the second side of the substrate.

In another embodiment, the present disclosure further provides an assembly that comprises a first semiconductor package comprising a first substrate and a first semiconductor die mounted on the first substrate in a wirebonding configuration using a bonding wire to electrically couple the first semiconductor die to the first substrate. The assembly further comprises a second semiconductor package comprising a second substrate and a second semiconductor die (i) mounted on the second substrate and (ii) electrically coupled to the first semiconductor die. Power and/or ground signals are routed between the first semiconductor die and the second semiconductor die using electrical connections of (i) the second substrate and (ii) not the first substrate.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques, structures, and various configurations for an electronic package assembly. In the following detailed description, reference is made to the accompanying drawings which form a part hereof, wherein like numerals designate like parts throughout. Other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as behind, over/under, or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
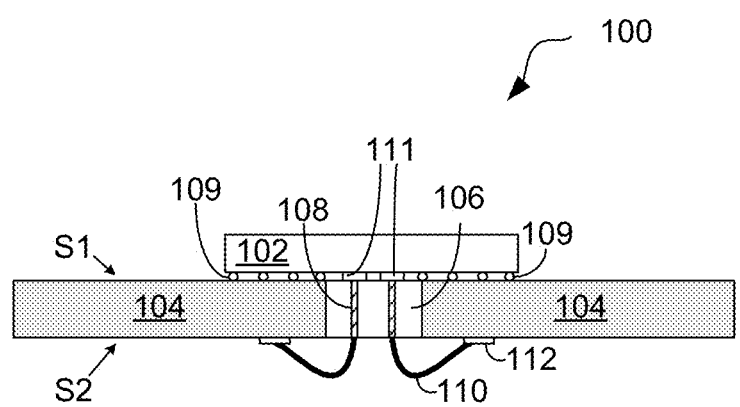
FIG. 1 schematically illustrates a side view of a first packaging configuration.

FIG. 1 schematically illustrates a side view of a first packaging configuration 100. The first packaging configuration 100 includes a substrate 104 having a first side S1 that is configured to receive a semiconductor die 102 and a second side S2 that is disposed opposite to the first side S1. The semiconductor die 102 may include a variety of integrated circuit devices, such as, memory components (e.g., dynamic random access memory). The substrate 104 includes an interposer 106 disposed in the substrate 104. The interposer 106 is configured to electrically couple the first side S1 of the substrate 104 and the second side S2 of the substrate 104.

According to various embodiments, the substrate 104 is a printed circuit board. The substrate 104 can be made using any of a variety of suitable printed circuit board materials including electrically insulative materials, such as, for example, polytetrafluoroethylene, cotton paper, epoxy, glass, polyester and suitable combinations thereof. The printed circuit board materials may comport with standards established by the National Electrical Manufacturers Association (NEMA) such as Flame Retardant 4 (FR-4), (FR-1), Composite Epoxy Material 1 (CEM-1), CEM-3, and the like. In other embodiments, the substrate 14 may be made of silicon.

The interposer 106 generally includes opposing surfaces that are substantially planar with the first side S1 and the second side S2 of the substrate 104. The interposer 106 in the substrate 104 can be formed, for example, by forming a window opening in the substrate 104 and subsequently forming or moving the interposer 106 within the window opening to provide the connected substrate 104 and interposer 106, as can be seen.

In some embodiments, the window opening is filled using a printed circuit board material to provide an interposer 106 (e.g., printed circuit board interposer) that substantially or wholly comprises a printed circuit board material. In other embodiments, the window opening is filled using a semiconductor material such as silicon to provide an interposer 106 (e.g., silicon interposer) that substantially or wholly comprises a semiconductor material. The semiconductor material is relatively harder than the printed circuit board material.

In an embodiment, the semiconductor die 102 is disposed on the first side S1 of the substrate 104 and electrically coupled to the second side S2 of the substrate 104 through the interposer 106. The depicted embodiment shows the semiconductor die 102 in a flip-chip configuration with the substrate 104, which refers to a configuration where an active side of the semiconductor die 102 is attached directly to the substrate 104 with solder balls 109 or other well known materials, such as, adhesive or glue. The active side generally includes a surface upon which a plurality of integrated circuit (IC) devices (not shown) such as transistors for logic and/or memory are formed. The active side of the semiconductor die 102 can be coupled to the substrate 104 by any well-known flip-chip technique such as using bump interconnects 111 to electrically couple the IC devices of the semiconductor die 102 with electrically conductive elements (e.g., one or more vias 108 of FIG. 1 or one or more first trace structures 114 of FIG. 3A) of the interposer 106. Other suitable configurations that may benefit from the principles described herein can be used in other embodiments including, for example, a wirebonding configuration for the semiconductor die 102.

The interposer 106 is generally configured to route electrical signals, such as, for example, power/ground signals and/or input/output (I/O) signals of the semiconductor die 102 and can include a shield (not shown). In one embodiment, the interposer 106 is configured to route power and/or ground signals of the semiconductor die 102 to the second side S2 of the substrate 104.

One or more vias 108 are formed through the interposer 106 to electrically couple the first side S1 and the second side S2 of the substrate 104. The one or more vias 108 are electrically conductive conduits comprising, for example, a metal. In an embodiment where the interposer 106 comprises a printed circuit board material, the one or more vias 108 can include through-hole vias (THVs). In an embodiment where the interposer 106 comprises a semiconductor material such as silicon, the one or more vias 108 can include through-silicon vias (TSVs).

One or more bonding wires 110 are electrically coupled to the one or more vias 108 to electrically route the electrical signals of the semiconductor die 102 between the one or more vias 108 and other electrically conductive structures disposed on the second side S2 of the substrate 104, such as, for example one or more bonding pads 112 that are formed on the second side S2 of the substrate 104 and configured to receive the one or more bonding wires 110. The one or more bonding wires 110 can be directly bonded using a wirebond connection to the one or more vias 108 and the one or more bonding pads 112, as can be seen. Any suitable technique, including ball bonding or wedge bonding techniques, can be used to form the wirebond connections of the one or more bonding wires 110.

Figure 2:
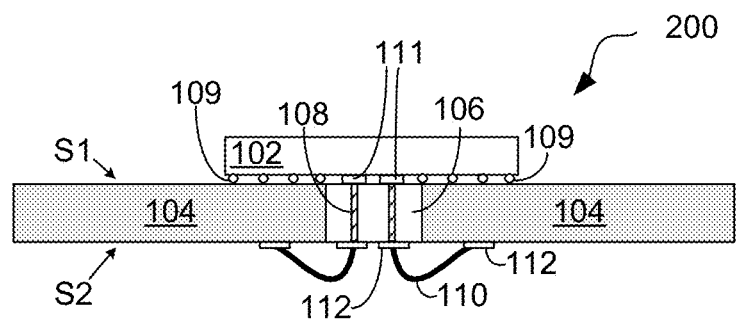
FIG. 2 schematically illustrates a side view of a second packaging configuration.

FIG. 2 schematically illustrates a side view of a second packaging configuration 200. The second packaging configuration 200 is similar to the first packaging configuration 100, with the addition of one or more bonding pads 112 being used as part of an electrical pathway between the one or more vias 108 and the one or more bonding wires 110. That is, the one or more bonding pads 112 are further formed on the interposer 106 and are configured to route the electrical signals of the semiconductor die 102 between the one or more vias 108 and the one or more bonding wires 110. Thus, a first bonding pad of the one or more bonding pads 112 can be used to form a wirebond connection with one end of a bonding wire of the one or more bonding wires 110 and a second bonding pad of the one or more bonding pads 112 can be used to form another wirebond connection with another end of the bonding wire.

Figure 3A:
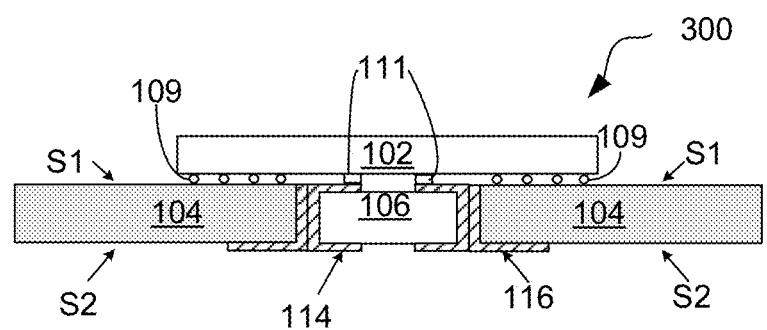
FIGS. 3A-3D schematically illustrate a side view of a third packaging configuration, a perspective view of the third packaging configuration, a bottom view of the third packaging configuration, and a side view of the third packaging configuration prior to moving an interposer into a window within a substrate, respectively.

FIG. 3A schematically illustrates a side view of a third packaging configuration 300. In the third packaging configuration 300, a connection contact such as, for example, one or more first trace structures 114 is used to electrically couple the semiconductor die 102 on the first side S1 of the substrate 104 with the second side S2 of the substrate 104 by way of the interposer 106, as can be seen. The connection contact can include any suitable electrically conductive structure (e.g., metal) that provides the benefits described herein in connection with the first trace structures 114.

The one or more first trace structures 114 are disposed between the material of the interposer 106 and the material of the substrate 104. In an embodiment, the one or more first trace structures 114 have a structure that includes a portion disposed on each of the top, side, and bottom of the interposer 106, as can be seen. In other words, each of the one or more first trace structures 114 includes a portion that is formed on each of at least two opposing surfaces of the interposer 106 and a portion that is formed on another surface of the interposer 106 that is substantially perpendicular to the opposing surfaces, where one of the at least two opposing surfaces is substantially planar with the first side S1 of the substrate 104 and the other of the at least two opposing surfaces is substantially planar with the second side S2 of the substrate 104.

The one or more first trace structures 114 are formed on the interposer 106 prior to coupling the interposer 106 within the window opening as previously described in connection with the first packaging configuration 100. One or more second trace structures 116 are formed on the second side S2 of the substrate 104 and on portions of the substrate 104 that are substantially perpendicular to the second side S2 of the substrate 104. The one or more second trace structures 116 are electrically coupled to the one or more first trace structures 114 to further route the electrical signals of the semiconductor die 102 on the second side S2 of the substrate 104 without using bonding wires (e.g., the one or more bonding wires 110 of FIGS. 1-2). Other structures that perform a similar function as the one or more second trace structures 116 can be used in other embodiments.

Figure 3B:
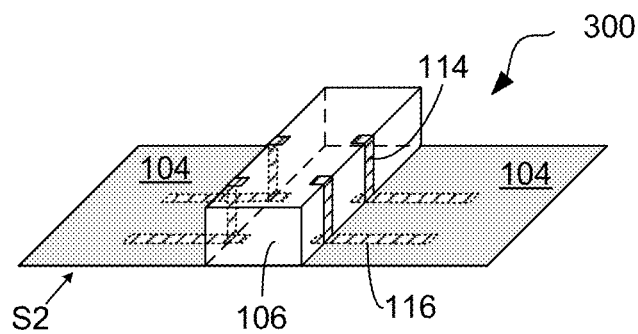

FIG. 3B schematically illustrates a perspective view of the third packaging configuration 300 of FIG. 3A. In the perspective view, the semiconductor die 102 has been omitted and only the second side S2 of the substrate 104 is depicted for the sake of clarity. Additionally, the one or more second trace structures formed on portions of the substrate 104 that are substantially perpendicular to the second side S2 of the substrate 104 have also been omitted for the sake of clarity. Dashed lines are used to represent features that are behind or underlie non-dashed features in FIG. 3B. In an embodiment, each of the one or more second trace structures 116 is electrically coupled to a corresponding one of the one or more first trace structures 114, as can be seen. A plurality of the one or more first trace structures 114 and second trace structures 116 can be used to provide multiple connections that correspond with electrical signals, e.g., power and/or ground signals, of the semiconductor die (e.g., the semiconductor die 102 of FIG. 3A).

Figure 3C:
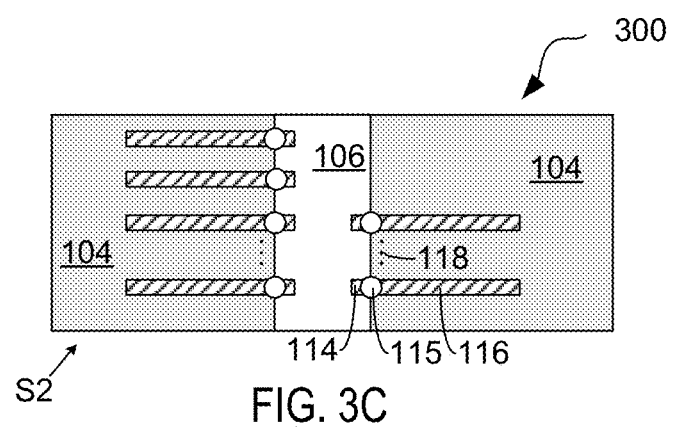

FIG. 3C schematically illustrates a bottom view of the third packaging configuration 300 of FIG. 3A. The ellipsis-like features 118 indicate that more trace structures (e.g., 114 and 116) than depicted can be used in other embodiments.

A physical and/or electrical connection between the one or more first trace structures 114 and the one or more second trace structures 116 can be formed by a compressive force between the interposer 106 and the substrate 104 (e.g., when coupling the interposer 106 to the substrate 104) that causes tight physical contact between the one or more first trace structures 114 and the one or more second trace structures 116.

The connection between the one or more first trace structures 114 and the one or more second trace structures 116 can be strengthened in a number of ways. In one embodiment, the connection is strengthened by forming a solder connection 115 (e.g., by inkjet soldering) between each of the one or more first trace structures 114 and the one or more second trace structures 116. Additionally, or in other embodiments, surface contact treatments or coatings such as, for example, nano-particle coatings can be used to strengthen the connection between the one or more first trace structures 114 and the one or more second trace structures 116. Fusible and/or eutectic metals or compositions such as, for example, gold and/or tin can also be used to fuse the one or more first trace structures 114 and the one or more second trace structures 116.

Figure 3D:
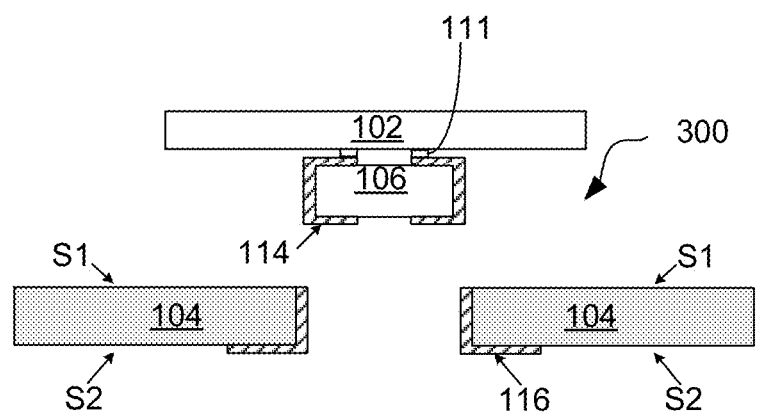

FIG. 3D schematically illustrates the interposer 106 relative to the semiconductor 102 prior to the interposer 106 being moved into the window opening within the substrate 104. The one or more first trace structures 114 and the one or more second trace structures 116 have already been formed on the interposer 106 and the substrate 104, respectively prior to moving the interposer 106 into the window opening of the substrate 104.

Figure 4A:
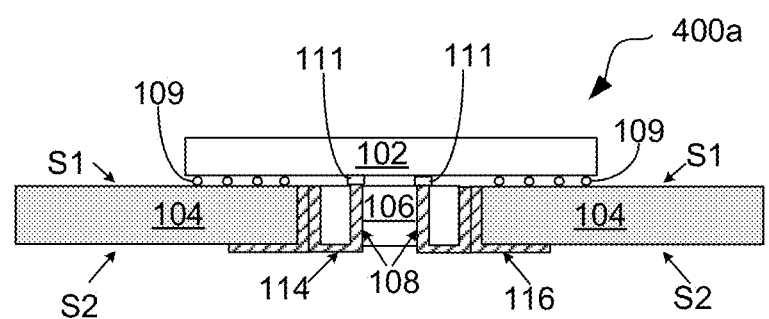
FIG. 4A schematically illustrates a side view of a fourth packaging configuration.

FIG. 4A schematically illustrates a side view of a fourth packaging configuration 400a. The fourth packaging configuration 400a includes an interposer 106 that includes two first trace structures 114. Similar to the embodiment illustrated in FIGS. 3A-3D, the two first trace structures 114 have a structure that includes a portion disposed on each of the side and bottom of the interposer 106, as can be seen in FIG. 4A. Each of the two first trace structures 114 also includes a portion that serves as a via 108 that extends through the interposer 106. The via portions 108 of the first trace structures 114 are electrically coupled to the semiconductor die 102 with bump interconnects 111.

Figure 4B:
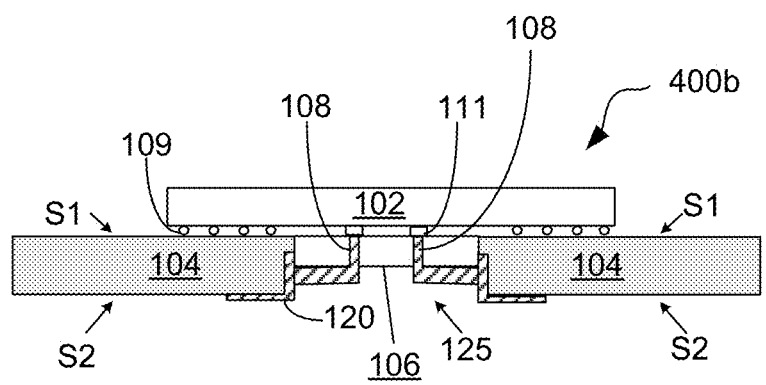
FIG. 4B schematically illustrates a side view of a fifth packaging configuration.

FIG. 4B schematically illustrates a side view of a fifth packaging configuration 400b. The fifth packaging configuration 400b includes an interposer 106 where a surface of the interposer 106 is recessed relative to the second side S2 of the substrate 104 to form a recessed region 125 in the substrate 104, as can be seen. The interposer 106 routes the electrical signals of the semiconductor die 102 between the first side 51 and the second side S2 of the substrate 104 using one or more vias 108 and one or more electrically conductive structures (e.g., trace structures 120) formed on the interposer 106 and the substrate 104, as can be seen.

Other analogous structures that perform similar functions as the one or more vias 108 and the trace structures 120 can be used in other embodiments. For example, the techniques and configurations described in connection with FIGS. 1-3D, including suitable combinations thereof, can be used to route the electrical signals of the semiconductor die 102 to the second side S2 of the substrate 104. The package configurations 100, 200, 300, and 400a-b of respective FIGS. 1, 2, 3A-3D, and 4A-4B can further include multi-layer interposer 106 configurations in various embodiments.

Figure 5:
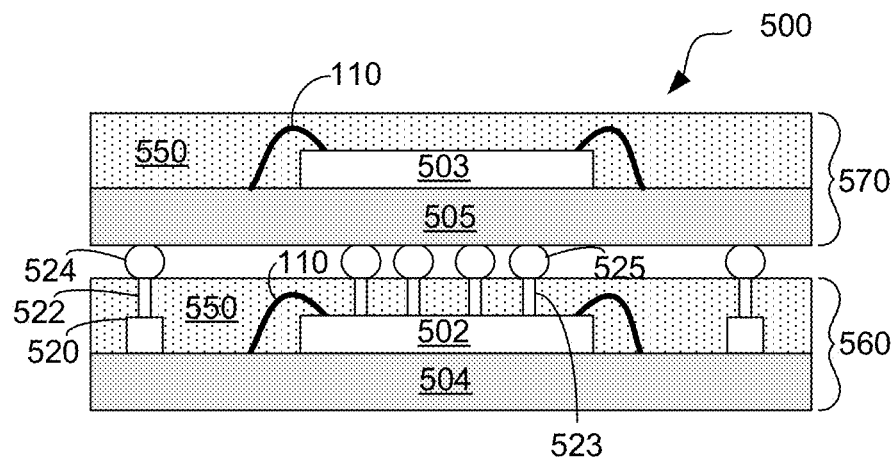
FIG. 5 schematically illustrates a side view of a sixth packaging configuration.

FIG. 5 schematically illustrates a side view of a sixth packaging configuration 500. The sixth packaging configuration 500 includes a first semiconductor package 560 including a first substrate 504 and a first semiconductor die 502 mounted on the first substrate 504 in a wirebonding configuration. That is, an active side of the first semiconductor die 502 is electrically coupled to the first substrate 504 using one or more bonding wires 110 and an inactive side of the first semiconductor die 502 is attached to the first substrate 504 (e.g., using an adhesive, not shown). In an embodiment, the first substrate 504 is a printed circuit board that is configured to couple with another external component, such as a socket of a computing device.

The packaging configuration 500 further includes a second semiconductor package 570 including a second substrate 505 and a second semiconductor die 503 that is mounted on the second substrate 505 in a wirebonding configuration, the second semiconductor die 503 being electrically coupled to the first semiconductor die 502 using electrical connections of the second substrate 505 and not the first substrate 504. That is, the second substrate 505 may comprise a dummy printed circuit board (e.g., dummy PCB) that functions as a power and/or ground distribution for the second semiconductor die 503 mounted on the second substrate 505. According to various embodiments, the second substrate 505 can include an interposer/substrate (e.g., 106/104) configuration as described in connection with FIGS. 1-4 to route the electrical signals through the second substrate 505.

According to various embodiments, one or more electrical signals (e.g., power and/or ground signals) can be routed between the first semiconductor die 502 and the second semiconductor die 503 without using electrical connections of the first substrate 504 by forming one or more electrically conductive first conduit structures 523 (e.g., vias) through a molding compound 550 that encapsulates the first semiconductor die 502, such that the one or more first conduit structures 523 are coupled to the first semiconductor die 502 to route the electrical signals of the first semiconductor die 502.

One or more first solder balls or bumps 525 are coupled to respective ones of the one or more first conduit structures 523 to route the electrical signals between the first semiconductor die 502 and the second substrate 505, as can be seen. The one or more first solder balls or bumps 525 can be directly bonded to the one or more first conduit structures 523 and the second substrate 505 in some embodiments.

The package configuration 500 can include one or more interconnect structures (e.g., pillar structure(s) 520, one or more second conduit structures 522, and one or more second solder balls or bumps 524) that are configured to route at least one electrical signal between the first semiconductor die 502 and the second semiconductor die 503 using electrical connections of both the first substrate 504 and the second substrate 505. That is, the at least one electrical signal can include, for example, an I/O signal or power/ground signal, that is routed from the first semiconductor die 502 to the first substrate 504 using the one or more bonding wires 110 bonded to the first semiconductor die 502. Electrical connections of the first substrate 504 such as traces (not shown) or other well-known redistribution structures can route the at least one electrical signal from the one or more bonding wires 110 to the pillar structure(s) 520, and, thus, to the second semiconductor die 503 through the one or more second conduit structures 522, the one or more second solder balls or bumps 524, the second substrate 505, and the one or more bonding wires 110 bonded to the second semiconductor die 503. In an embodiment, the one or more second solder balls or bumps 524 are formed on the molding compound 550 and attached to the second substrate 505, as can be seen. In some embodiments, the majority or all of the power and/or ground signals are routed via the one or more first conduit structures 523 and the first solder balls or bumps 525 and then redistributed via the second substrate 505; while the majority or all of the I/O or data signals are routed via the bonding wires 110, the first substrate 504 and the interconnect structures (e.g., pillar structures 520, second conduit structures 522 and second solder balls or bumps 524).

Figure 6:
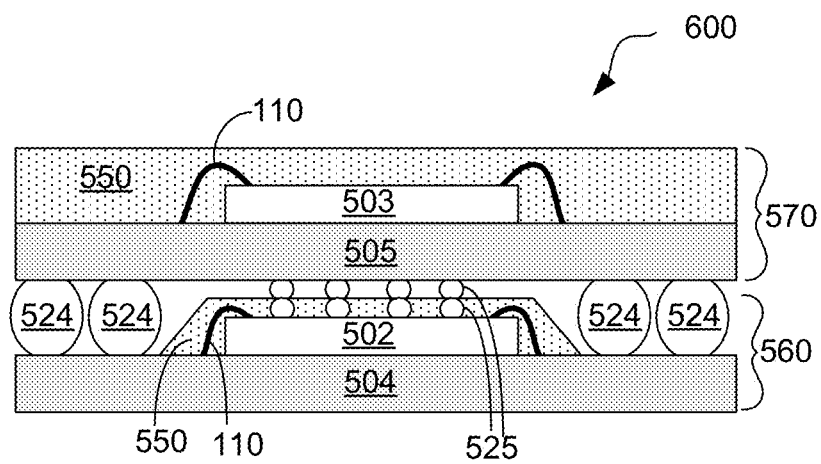
FIG. 6 schematically illustrates a side view of a seventh packaging configuration.

FIG. 6 schematically illustrates a side view of a seventh packaging configuration 600. The seventh packaging configuration 600 depicts an alternative configuration for the routing of electrical signals between the first semiconductor die 502 and the second semiconductor die 503, which routing is similar to the routing described in connection with FIG. 5.

As can be seen, the one or more first conduit structures 523 of FIG. 5 have been replaced with additional one or more first solder balls or bumps 525 disposed on the first semiconductor die 502 in FIG. 6. The one or more first solder balls or bumps 525 are stacked in FIG. 6 to provide an electrical pathway between the first semiconductor die 502 and the second semiconductor die 503 without using electrical connections of the first substrate 504 (e.g., without routing the electrical signals of the first semiconductor die 502 through the first substrate 504).

Additionally, the molding compound 550 does not encapsulate a portion of the first substrate 504, such that one or more second solder balls or bumps 524 can be attached to the first substrate 504 and the second substrate 505 in an area that is external to the molding compound 550. The one or more second solder balls or bumps 524 can be used to route electrical signals between the first semiconductor die 502 and the second semiconductor die 503 in FIG. 6 in a similar way as the pillar structure(s) 520, the one or more second conduit structures 522, and the one or more second solder balls or bumps 524. In some embodiments, the majority or all of the power and/or ground signals are routed via the one or more first solder balls or bumps 525 and then redistributed via the second substrate 505; while the majority or all of the I/O or data signals are routed via the bonding wires 110, the first substrate 504 and the second solder balls or bumps 524.

According to various embodiments, the first semiconductor die 502 and/or the second semiconductor die 503 of FIGS. 5-6 can comprise a system-on-a-chip (SOC) including a processor and/or memory. In one embodiment, the first semiconductor die 502 comprises a processor and the second semiconductor die 503 comprises memory, such as dynamic random-access memory (DRAM). Although the first semiconductor die 502 and the second semiconductor die 503 are mounted in a wirebonding configuration in FIGS. 5-6, other suitable configurations, such as, for example, flip-chip configurations, that may benefit from the principles described herein can be used in other embodiments.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An assembly comprising:
 a first semiconductor package comprising:
  a first substrate, and
  a first semiconductor die mounted on the first substrate in a wirebonding configuration using a bonding wire to electrically couple the first semiconductor die to the first substrate;
 a second semiconductor package comprising:
  a second substrate, and
  a second semiconductor die (i) mounted on the second substrate and (ii) electrically coupled to the first semiconductor die, wherein power and/or ground signals are routed between the first semiconductor die and the second semiconductor die using electrical connections of (i) the second substrate and (ii) not the first substrate;
 a molding compound substantially encapsulating the first semiconductor die and the bonding wire; and
 a through-hole via formed through the molding compound and coupled to the first semiconductor die, wherein the through-hole via is electrically connected between the first semiconductor die and the second semiconductor die to route the power and/or ground signals between the first semiconductor die and the second semiconductor die.

2. The assembly of claim 1, further comprising:
 a solder ball or bump disposed on the through-hole via where the through-hole via terminates on a surface of the molding compound.

3. The assembly of claim 1, further comprising:
 one or more interconnect structures that are configured to route at least one electrical signal between (i) the first semiconductor die and (ii) the second semiconductor die using electrical connections of (i) the first substrate and (ii) the second substrate, the at least one electrical signal being a signal other than the power and/or ground signals of the first semiconductor die.

4. The assembly of claim 3, wherein the one or more interconnect structures comprise:
a pillar structure disposed on the first substrate;
a solder ball or bump (i) formed on the molding compound and (ii) attached to the second substrate; and
a conduit structure formed in the molding compound to electrically couple the pillar structure and solder ball or bump.

5. The assembly of claim 3, wherein the one or more interconnect structures comprise a solder ball or bump that is attached to (i) the first substrate and (ii) the second substrate in an area that is external to the molding compound.

6. The assembly of claim 3, wherein:
the first semiconductor die comprises a processor; and
the second semiconductor die comprises memory.

7. The assembly of claim 1, wherein
the second semiconductor package comprises an interposer that is (i) disposed in the second substrate and (ii) configured to electrically couple a first side of the second substrate and a second side of the second substrate, the interposer comprising a semiconductor material and the second substrate comprising a printed circuit board material, and
the second semiconductor die is (i) disposed on the first side of the second substrate and (ii) electrically coupled to the second side of the second substrate through the interposer, the interposer being configured to route the power and/or ground signals of the second semiconductor die.

8. The assembly of claim 7, wherein:
the second semiconductor die is disposed in a flip-chip configuration with the second substrate.

9. The assembly of claim 7, wherein the printed circuit board material comprises an epoxy.

10. The assembly of claim 7, wherein the semiconductor material of the interposer comprises silicon, the interposer comprising a through-silicon via (TSV) formed therein to electrically couple the first side of the second substrate and the second side of the second substrate.

11. The assembly of claim 10, further comprising:
a bonding pad that is (i) formed on the second side of the second substrate and (ii) configured to receive a wirebond connection of the bonding wire, wherein the bonding wire is (i) electrically coupled to the through-silicon via and (ii) configured to route electrical signals of the semiconductor die between the through-silicon via and the bonding pad.

12. The assembly of claim 11, wherein the bonding pad is a first bonding pad and the second semiconductor package further comprises:
a second bonding pad that is (i) formed on the interposer and (ii) configured to receive another wirebond connection of the bonding wire.

13. The assembly of claim 7, wherein the second semiconductor package further comprises
a connection contact disposed between (i) the semiconductor material of the interposer and (ii) the printed circuit board material of the second substrate, the connection contact being configured to electrically couple the first side of the second substrate and the second side of the second substrate.

14. The assembly of claim 13, wherein the connection contact comprises a first trace structure that is (i) formed on at least two opposing surfaces of the interposer and (ii) configured to route one or more electrical signals of the semiconductor die, the second semiconductor package further comprising:
a second trace structure that is (i) formed on the second side of the second substrate to further route the one or more electrical signals of the semiconductor die and (ii) electrically coupled to the first trace structure.

15. The assembly of claim 14, wherein a connection between the first trace structure and the second trace structure is formed by a compressive force between the interposer and the second substrate that causes tight physical contact between the first trace structure and the second trace structure.

16. The assembly of claim 15, wherein the connection between the first trace structure and the second trace structure is strengthened by at least one a (i) solder connection formed between the first trace structure and the second trace structure and a (ii) nano-particle coating formed on at least one of the first trace structure and the second trace structure.

17. The assembly of claim 7, wherein a surface of the interposer is recessed relative to the second side of the second substrate to provide a recessed region.

18. The assembly of claim 17, wherein the first side of the second substrate is electrically coupled to the second side of the second substrate by (i) a through-hole via formed through the interposer and (ii) one or more trace structures formed on the interposer and the second substrate.

19. The assembly of claim 7, wherein:
the first semiconductor die comprises a processor; and
the second semiconductor die comprises memory.

20. An assembly comprising:
a first semiconductor package comprising:
a first substrate, and
a first semiconductor die mounted on the first substrate in a wirebonding configuration using a bonding wire to electrically couple the first semiconductor die to the first substrate,
a molding compound formed to substantially encapsulate the first semiconductor die and the bonding wire; and
a second semiconductor package comprising:
a second substrate,
a second semiconductor die (i) mounted on the second substrate and (ii) electrically coupled to the first semiconductor die, wherein power and/or ground signals are routed between the first semiconductor die and the second semiconductor die using electrical connections of (i) the second substrate and (ii) not the first substrate; and
one or more interconnect structures that are configured to route at least one electrical signal between (i) the first semiconductor die and (ii) the second semiconductor die using electrical connections of (i) the first substrate and (ii) the second substrate, the at least one electrical signal being a signal other than the power and/or ground signals of the first semiconductor die.

21. The assembly of claim 20, wherein the one or more interconnect structures comprise:
a pillar structure disposed on the first substrate;
a solder ball or bump (i) formed on the molding compound and (ii) attached to the second substrate; and
a conduit structure formed in the molding compound to electrically couple the pillar structure and solder ball or bump.

22. The assembly of claim 20, wherein the one or more interconnect structures comprise a solder ball or bump that is attached to (i) the first substrate and (ii) the second substrate in an area that is external to the molding compound.

23. The assembly of claim 20, wherein:
the first semiconductor die comprises a processor; and
the second semiconductor die comprises memory.

24. An assembly comprising:
a first semiconductor package comprising:
   a first substrate, and
   a first semiconductor die mounted on the first substrate in a wirebonding configuration using a bonding wire to electrically couple the first semiconductor die to the first substrate; and
a second semiconductor package comprising:
   a second substrate, and
   a second semiconductor die (i) mounted on the second substrate and (ii) electrically coupled to the first semiconductor die, wherein power and/or ground signals are routed between the first semiconductor die and the second semiconductor die using electrical connections of (i) the second substrate and (ii) not the first substrate, wherein
   the second semiconductor package comprises an interposer that is (i) disposed in the second substrate and (ii) configured to electrically couple a first side of the second substrate and a second side of the second substrate, the interposer comprising a semiconductor material and the second substrate comprising a printed circuit board material,
   the second semiconductor die is (i) disposed on the first side of the second substrate and (ii) electrically coupled to the second side of the second substrate through the interposer, the interposer being configured to route the power and/or ground signals of the second semiconductor die, and
   the semiconductor material of the interposer comprises silicon, the interposer comprising a through-silicon via (TSV) formed therein to electrically couple the first side of the second substrate and the second side of the second substrate;
   a bonding wire; and
   a bonding pad that is (i) formed on the second side of the second substrate and (ii) configured to receive a wirebond connection of the bonding wire, wherein the bonding wire is (i) electrically coupled to the through-silicon via and (ii) configured to route electrical signals of the semiconductor die between the through-silicon via and the bonding pad.

25. The assembly of claim 24, wherein the bonding pad is a first bonding pad and the second semiconductor package further comprises:
   a second bonding pad that is (i) formed on the interposer and (ii) configured to receive another wirebond connection of the bonding wire.

* * * * *